(12) United States Patent
Yonetsu et al.

(10) Patent No.: US 12,343,820 B2
(45) Date of Patent: Jul. 1, 2025

(54) BRAZING MATERIAL, BONDED BODY, CERAMIC CIRCUIT BOARD, AND METHOD FOR MANUFACTURING BONDED BODY

(71) Applicants: KABUSHIKI KAISHA TOSHIBA, Tokyo (JP); TOSHIBA MATERIALS CO., LTD., Yokohama (JP)

(72) Inventors: Maki Yonetsu, Mitaka (JP); Seiichi Suenaga, Yokohama (JP); Sachiko Fujisawa, Kawasaki (JP); Takashi Sano, Fujisawa (JP)

(73) Assignees: KABUSHIKI KAISHA TOSHIBA, Tokyo (JP); TOSHIBA MATERIALS CO., LTD., Yokohama (JP)

( * ) Notice: Subject to any disclaimer, the term of this patent is extended or adjusted under 35 U.S.C. 154(b) by 128 days.

(21) Appl. No.: 17/826,493

(22) Filed: May 27, 2022

(65) Prior Publication Data

US 2022/0288726 A1  Sep. 15, 2022

Related U.S. Application Data

(63) Continuation of application No. PCT/JP2021/004956, filed on Feb. 10, 2021.

(30) Foreign Application Priority Data

Feb. 17, 2020  (JP) .................................. 2020-024184

(51) Int. Cl.
*B23K 1/00* (2006.01)
*B23K 35/30* (2006.01)
(Continued)

(52) U.S. Cl.
CPC ........ *B23K 35/3006* (2013.01); *B23K 1/0016* (2013.01); *B32B 15/04* (2013.01);
(Continued)

(58) Field of Classification Search
CPC .... B23K 1/0016; B23K 1/19; B23K 35/0244; B23K 35/025; B23K 35/3006;
(Continued)

(56) References Cited

U.S. PATENT DOCUMENTS

2003/0068532 A1* 4/2003 Tsukaguchi ........... C04B 35/581
                                                        428/698
2016/0221305 A1* 8/2016 Terasaki .................... B32B 7/12
(Continued)

FOREIGN PATENT DOCUMENTS

CN       101332545 A     12/2008
EP       2 436 475 A1    4/2012
(Continued)

OTHER PUBLICATIONS

International Search Report issued May 11, 2021 in PCT/JP2021/004956 filed on Feb. 10, 2021, 2 pages.
(Continued)

*Primary Examiner* — Kevin C T Li
(74) *Attorney, Agent, or Firm* — Oblon, McClelland, Maier & Neustadt, L.L.P.

(57) ABSTRACT

According to one embodiment, when a DSC curve is measured using a differential scanning calorimeter (DSC) for a brazing material for bonding a ceramic substrate and a metal plate, the brazing material has an endothermic peak within a range of not less than 550° C. and not more than 700° C. in a heating process. The brazing material favorably includes Ag, Cu, and Ti. The brazing material favorably has not less than two of the endothermic peaks within a range of not less than 550° C. and not more than 650° C. in the heating process.

17 Claims, 10 Drawing Sheets

(51) Int. Cl.
*B32B 15/04* (2006.01)
*B32B 15/20* (2006.01)
*B32B 18/00* (2006.01)
*C04B 37/02* (2006.01)
*C22C 30/02* (2006.01)
*H05K 3/38* (2006.01)
*B23K 101/42* (2006.01)
*B23K 103/00* (2006.01)
*B23K 103/12* (2006.01)
*B23K 103/18* (2006.01)

(52) U.S. Cl.
CPC .............. *B32B 15/20* (2013.01); *B32B 18/00* (2013.01); *C04B 37/023* (2013.01); *C22C 30/02* (2013.01); *H05K 3/388* (2013.01); *B23K 2101/42* (2018.08); *B23K 2103/12* (2018.08); *B23K 2103/18* (2018.08); *B23K 2103/52* (2018.08); *C04B 2237/125* (2013.01); *C04B 2237/368* (2013.01); *C04B 2237/407* (2013.01); *H05K 2203/04* (2013.01)

(58) Field of Classification Search
CPC ............................ B23K 35/34; B23K 2101/42; B23K 2103/12; B23K 2103/18; B23K 2103/52; B32B 7/12; B32B 15/04; B32B 15/20; B32B 2250/40; B32B 2255/06; B32B 2255/205; B32B 2307/302; B32B 2307/732; B32B 2457/08; C04B 37/023; C04B 37/026; C04B 2237/124; C04B 2237/125; C04B 2237/368; C04B 2237/407; C04B 2237/706; C22C 5/08; C22C 30/02; H05K 1/0306; H05K 1/0271; H05K 30/02; H05K 3/388; H05K 3/1291; H05K 2201/0355; H05K 2303/1126; H05K 2303/04
See application file for complete search history.

(56) References Cited

U.S. PATENT DOCUMENTS

| | | |
|---|---|---|
| 2016/0276244 A1 | 9/2016 | Terasaki et al. |
| 2018/0005918 A1* | 1/2018 | Naba .................... H05K 1/0265 |
| 2020/0128664 A1 | 4/2020 | Harada et al. |

FOREIGN PATENT DOCUMENTS

| | | | |
|---|---|---|---|
| EP | 3 492 441 A1 | | 6/2019 |
| JP | 04-305073 A | | 10/1992 |
| JP | 7-82050 A | | 3/1995 |
| JP | 2003-034585 A | | 2/2003 |
| JP | 2012-115846 A | | 6/2012 |
| JP | 2014-091673 A | | 5/2014 |
| JP | 2014090144 A | * | 5/2014 |
| JP | 5720839 B2 | | 5/2015 |
| JP | WO2018/021472 A1 | | 2/2018 |
| JP | WO2018/199060 A1 | | 11/2018 |

OTHER PUBLICATIONS

Handbook of Brazing and Soldering (Jan. 31, 2018).
Chinese Decision of Refusal issued on Sep. 13, 2024, in the counterpart Chinese patent application No. 202180007559.5.

* cited by examiner

BRAZING MATERIAL, BONDED BODY, CERAMIC CIRCUIT BOARD, AND METHOD FOR MANUFACTURING BONDED BODY

CROSS-REFERENCE TO RELATED APPLICATIONS

This is a continuation application of International Patent Application PCT/JP2021/004956, filed on Feb. 10, 2021. This application also claims priority to Japanese Patent Application No. 2020-024184, filed on Feb. 17, 2020. The entire contents of which are incorporated herein by reference.

FIELD

Embodiments described below relate to a brazing material, a bonded body, a ceramic circuit board, and a method for manufacturing a bonded body.

BACKGROUND

A bonded body of a ceramic substrate and a copper plate is used in a circuit board on which a semiconductor element or the like is mounted. International Publication No. 2018/021472 discusses a ceramic copper circuit board in which a ceramic substrate and a copper plate are bonded. In International Publication No. 2018/021472, a bonding layer includes a brazing material including Ag, Cu, Ti, etc. Also, TCT characteristics are improved by controlling the nanoindentation hardness of the bonding layer. In International Publication No. 2018/021472, the nanoindentation hardness is controlled by causing a AgTi crystal or TiC to exist in the bonding layer. In International Publication No. 2018/021472, the bonding strength and the TCT characteristics are improved by controlling the nanoindentation hardness.

In International Publication No. 2018/021472, the bonding is performed at a high bonding temperature of 780 to 850° C. The load of the bonding equipment increases when the bonding temperature is high. Also, in bonding at high temperatures, thermal stress is applied to the ceramic substrate or the copper plate. The load of the thermal stress is a cause of distortion of the ceramic copper circuit board. It is therefore desirable to bond at a lower temperature.

For example, International Publication No. 2018/199060 discusses a ceramic copper circuit board that is bonded at a bonding temperature of 720 to 800° C.

DETAILED DESCRIPTION

Figure 1:
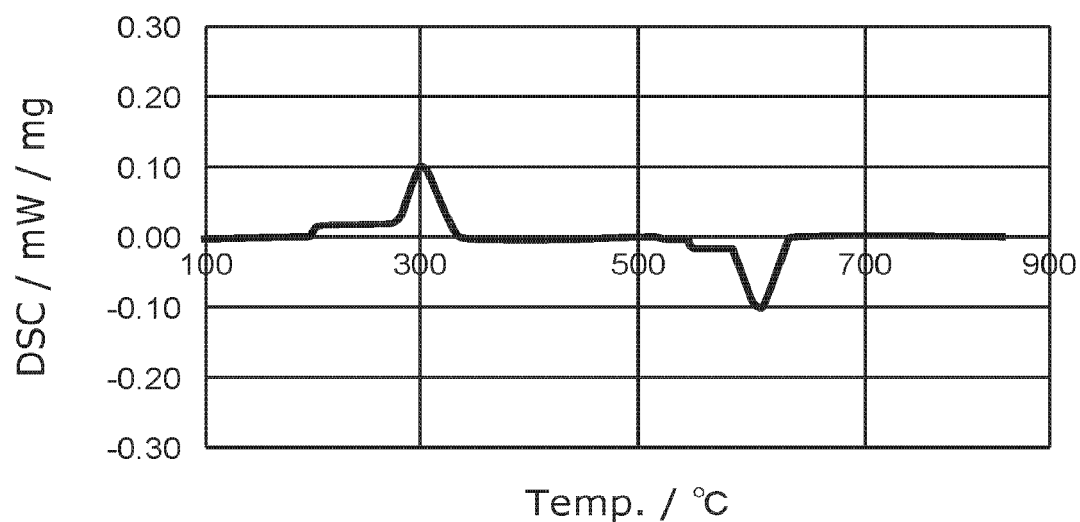
FIG. 1 is a schematic view illustrating a DSC curve.

According to one embodiment, a brazing material for bonding a ceramic substrate and a copper plate includes Ag, Cu, and Ti. The brazing material has an endothermic peak within a range of not less than 550° C. and not more than 700° C. in a heating process when a DSC curve is measured using a differential scanning calorimeter (DSC).

The brazing material according to the embodiment is for bonding a ceramic substrate and a metal plate. A silicon nitride substrate, an aluminum nitride substrate, an aluminum oxide substrate, an Alumina zirconia substrate, etc., are examples of the ceramic substrate. An Alumina zirconia substrate is a substrate in which aluminum oxide and zirconium oxide are mixed.

A copper plate, an aluminum plate, etc., are examples of the metal plate. The copper plate is not limited to a pure copper plate and may be a copper alloy plate. Examples of the copper plate are included in JIS-H-3100. Among these, oxygen-free copper (having a copper purity of not less than 99.96 wt %) is favorable.

An active metal brazing material is favorable as the brazing material. The active metal is one selected from Ti (titanium), Zr (zirconium), and Hf (hafnium). A bonding method that uses an active metal brazing material is called active metal bonding. Among active metals, Ti is favorable. Ti is a metal that is more active than Zr and Hf. Also, the cost of Ti is inexpensive compared to Zr and Hf. The active metal is not limited to a simple metal and may be added to the brazing material as a compound. A hydride, an oxide, a nitride, etc., are examples of the compound.

A bonding technique that uses an active metal brazing material is called active metal bonding. Active metal bonding is a method of manufacturing a bonded body by disposing an active metal brazing material between a ceramic substrate and a metal plate and by performing thermal bonding. The active metal brazing material becomes a bonding layer due to the thermal bonding. That is, the active metal brazing material corresponds to the brazing material before bonding. The bonding layer refers to the state after bonding.

In active metal bonding, the active metal and the ceramic react, and a reaction layer is formed. When Ti (titanium) is used as the active metal, Ti and the ceramic substrate react, and a Ti reaction layer is formed. When a nitride ceramic substrate is used, a Ti reaction layer that includes titanium nitride (TiN) as a major component is formed. Also, when an oxide ceramic substrate is used, a Ti reaction layer that includes titanium oxide ($TiO_2$) as a major component is formed. Nitride ceramic substrate refers to a silicon nitride substrate or an aluminum nitride substrate. Oxide ceramic substrate refers to an aluminum oxide substrate or an Alumina zirconia substrate. Also, a portion of the active metal brazing material layer may be diffused into the metal plate by the thermal bonding.

It is favorable for the brazing material to include one, two, or more selected from Ag (silver), Cu (copper), Sn (tin), In (indium), and C (carbon) as a component other than the active metal. Ag or Cu is a component used as the base material of the brazing material. Also, Sn or In has the effect of lowering the melting point of the brazing material. Also, C has the effect of controlling the fluidity of the brazing material and/or controlling the structure of the bonding layer by reacting with other components. Therefore, Ag—Cu—Ti, Ag—Cu—Sn—Ti, Ag—Cu—Ti—C, Ag—Cu—Sn—Ti—C, Ag—Ti, Cu—Ti, Ag—Sn—Ti, Cu—Sn—Ti, Ag—Ti—C, Cu—Ti—C, Ag—Sn—Ti—C, and Cu—Sn—Ti—C are examples of components of the brazing material. In may be used instead of Sn. Both Sn and In may be used. Instead of Sn or In, a low melting-point metal such as Bi (bismuth), Sb (antimony), Ga (gallium), etc., may be used.

First, the DSC curve of the brazing material is measured using a differential scanning calorimeter (Differential scanning calorimetry: DSC). A differential scanning calorimeter applies heat to a sample and measures the existence or absence of endothermic reactions or exothermic reactions. A peak occurs in the DSC curve when an endothermic reaction or an exothermic reaction occurs. A peak in the negative direction indicates an endothermic reaction. A peak in the positive direction indicates an exothermic reaction. An endothermic reaction indicates that melting, decomposition, etc., of the sample has occurred. An exothermic reaction indicates that elemental components of the sample have reacted with each other, and a compound (including alloying) has formed or solidified. It can be seen that the heat of reaction increases as the peak increases. Here, a peak in the negative direction is called an endothermic peak; and a peak in the positive direction is called an exothermic peak. Also, the apex of a peak is called the peak top. The difference between the maximum point and the minimum point of a peak is called the peak height.

FIG. 1 is a schematic view illustrating a DSC curve.

In FIG. 1, the horizontal axis is the temperature (° C.), and the vertical axis is the heat flux (mW/mg). In the example of FIG. 1, a peak in the positive direction occurs at 300° C. This indicates that an exothermic reaction occurs at 300° C. Also, a peak in the negative direction occurs at 600° C. This indicates that an endothermic reaction occurs at 600° C.

Figure 2A:
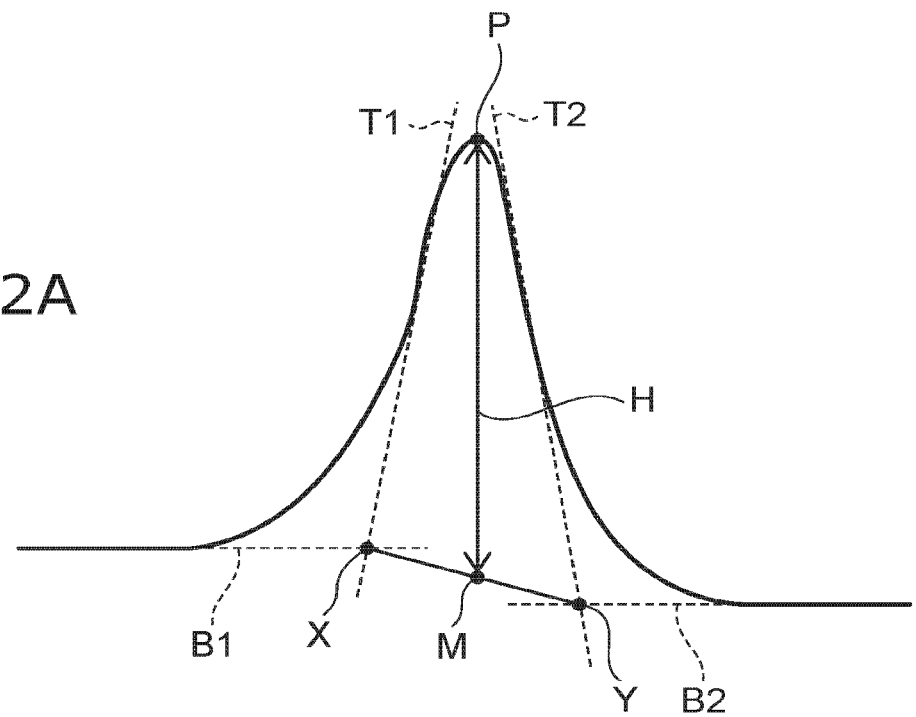
FIGS. 2A and 2B are drawings for describing a method for calculating the peak height of the DSC curve.
Figure 2B:
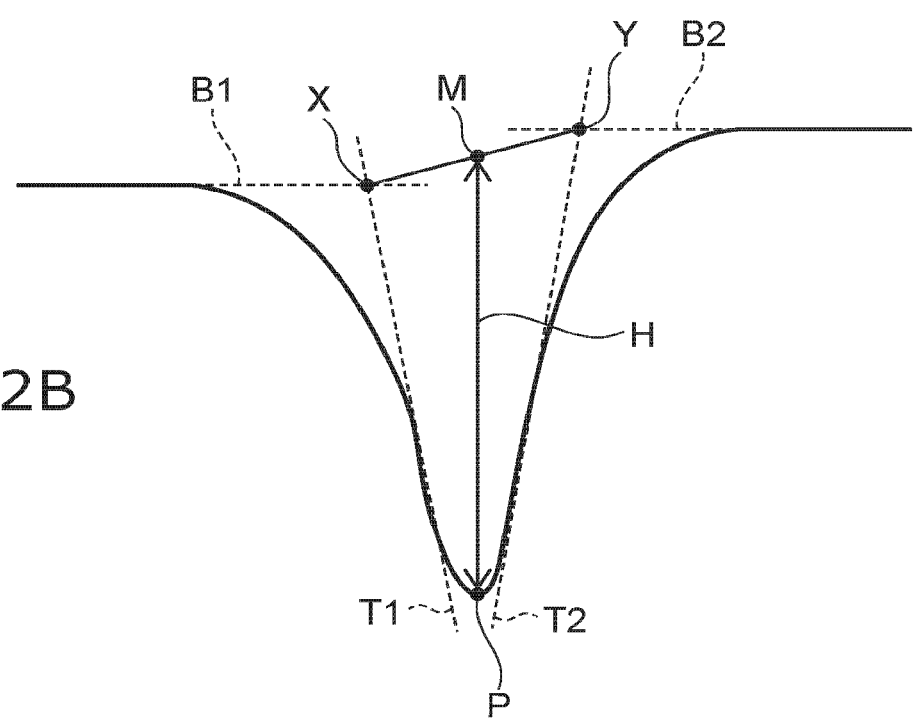

FIGS. 2A and 2B are drawings for describing a method for calculating the peak height of the DSC curve.

FIG. 2A illustrates a peak in the positive direction. FIG. 2B illustrates a peak in the negative direction. As shown in FIGS. 2A and 2B, a baseline extension line B1 is generated at peak left (left facing the page surface). The baseline extension line B1 is a horizontal line from the base at peak left (the so-called peak start). A tangent T1 is generated as the longest straight line along the peak left side surface. An intersection X between the baseline extension line B1 and the tangent T1 is generated. A baseline extension line B2 is generated at peak right (right facing the page surface). The baseline extension line B2 is a horizontal line from the base at peak right (the so-called peak end). A tangent T2 is generated as the longest straight line along the peak right side surface. An intersection Y between the baseline extension line B2 and the tangent T2 is generated. An intersection M is generated between a straight line X-Y connecting the intersection X and the intersection Y and a line from a peak top P perpendicularly downward toward the horizontal axis. The distance between the intersection M and the peak top P is determined to be a peak height H. Here, when heating and when cooling, a peak height H that is not less than 0.01 mW/mg is extracted as a peak.

For example, an endothermic peak is in the negative direction and therefore rises, drops, and rises. The endothermic peaks include maximum point→minimum point→maximum point. The minimum point (the lowest location) is the peak top. Also, among the maximum points at the low-temperature side and the high-temperature side of the minimum point, the greatest value is taken to be the highest maximum point. The peak height is the value of the minimum point subtracted from the highest maximum point.

An exothermic peak is in the positive direction and therefore drops, rises, and drops. The exothermic peak includes minimum point→maximum point→minimum point. The maximum point (the highest location) is the peak top. Also, among the minimum points at the low-temperature side and the high-temperature side of the maximum point, the greatest value is the lowest minimum point. The peak height is the value of the lowest minimum point subtracted from the maximum point.

Although there are also cases where the end point of an endothermic peak (a peak in the negative direction) appears to be an exothermic peak (a peak in the positive direction), herein, such peaks are counted as exothermic peaks. Also, each peak may be determined by drawing baseline extension lines.

Figure 3:
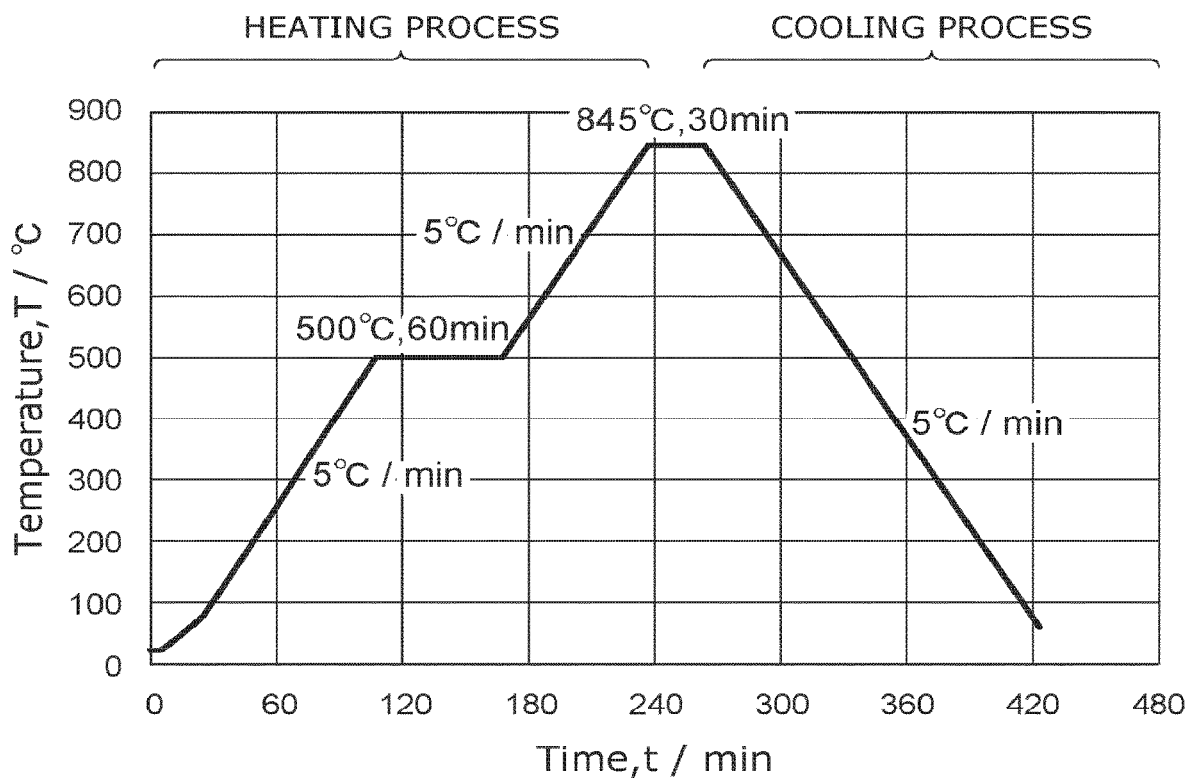
FIG. 3 is a temperature program for measuring the DSC graph.

FIG. 3 shows a temperature program for measuring the DSC curve. In FIG. 3, the horizontal axis is time (minutes), and the vertical axis is the temperature (° C.). The heating process heats from room temperature to 500° C. at a heating rate of 5° C./min. Then, the heating process maintains 500° C. for 60 minutes. Then, the heating process heats to 845° C. at a heating rate of 5° C./min. Subsequently, the temperature of 845° C. is maintained for 30 minutes. The cooling process cools from 845° C. to room temperature at a cooling rate of 5° C./min.

Also, for DSC, the TGA-DSC simultaneous thermal analyzer STA449-F3-Jupiter manufactured by NETZSCH or an apparatus having equivalent performance can be used. Also, the measurement is performed in an Ar (argon) flow by dropping an appropriate amount of the brazing material into an alumina container. It is necessary to prevent a reaction of the brazing material and the atmosphere by measuring in an Ar atmosphere. Also, the flow rate of the Ar flow is set to 20 ml/minute at the sample side and 200 ml/minute at the cooling side. The amount (mg) that is dropped is measured using a balance. A DSC curve in the range of not less than 100° C. and not more than 845° C. is measured using the method described above. That is, a DSC curve is a profile obtained using a DSC in which the heat flux change is plotted versus temperature. Also, DSC labeled at the vertical axis of the DSC curve indicates the heat flux (the heat flux) measured by the DSC.

Also, it is favorable to measure the DSC curve of the brazing material before performing the bonding process.

When measuring the DSC curve from the state of the bonded body, the measurement is performed using a sample of the bonding layer cut from the bonded body.

The bonding layer of the bonded body exists between the ceramic substrate and the metal plate. When preparing a sample of the bonding layer cut from the bonded body, the ceramic substrate and the metal plate are not included. A Ti reaction layer that exists in the ceramic substrate surface may be included in the bonding layer. When it is difficult to cut at the boundary of the ceramic substrate and the Ti reaction layer, a portion of the Ti reaction layer may be included in the sample.

Also, the active metal brazing material is bonded while diffusing into the metal plate. When preparing a sample of the bonding layer cut from the bonded body, the region that is diffused into the metal plate is not included. That is, only the bonding layer portion is used as the measurement sample.

For example, when using a Ag—Cu—Ti active metal brazing material to bond a copper plate, the brazing material diffuses into the copper plate. Because Cu is used as a brazing material component, there is a possibility that the boundary between the bonding layer and the copper plate may be difficult to discriminate. Therefore, the region within 20 μm from the Ti reaction layer toward the copper plate is taken as the boundary. Also, 1 g of the sample is cut out.

The brazing material according to the embodiment has an endothermic peak within the range of not less than 550° C. and not more than 700° C. in the heating process.

Figure 4:
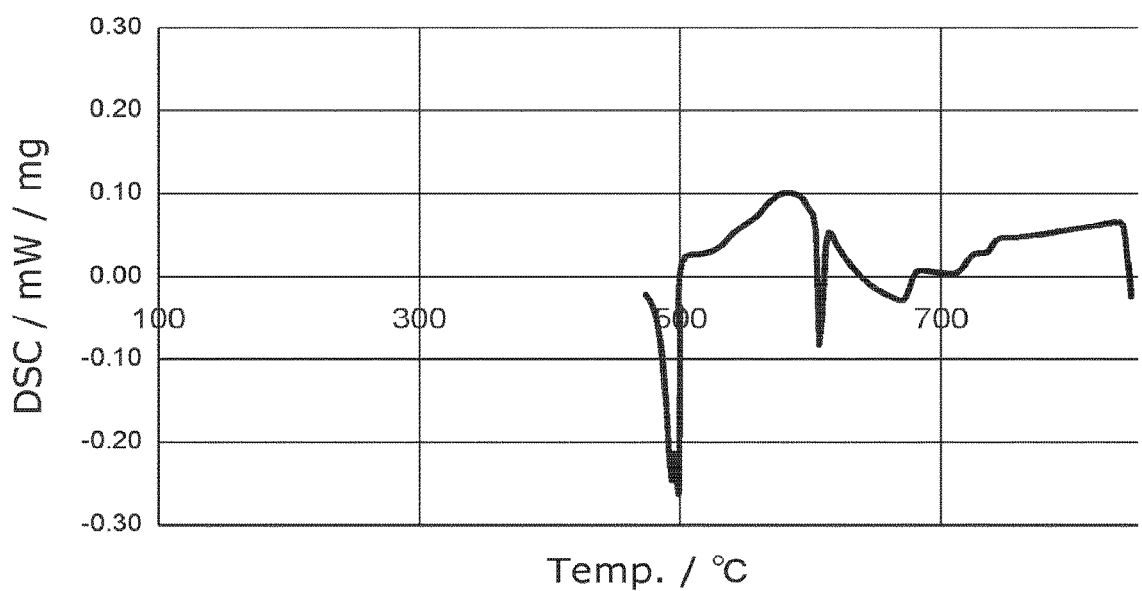
FIG. 4 is an example of the DSC curve (not less than 450° C.) of the heating process of an example 1.

FIG. 4 shows a DSC curve of the heating process of an example 1. In FIG. 4, the horizontal axis is the temperature (° C.), and the vertical axis is the heat flux (mW/mg). The heat flux is labeled as DSC. FIG. 4 shows the range of not less than 450° C. of the DSC curve that is not less than 100° C. and not more than 845° C. Also, according to the embodiment, peaks that have a peak height of not less than 0.01 mW/mg are counted as peaks.

In FIG. 4, endothermic peaks are detected at 498° C., 606° C., 671° C., and 713° C. Also, exothermic peaks are detected at 581° C. and 619° C. Also, although not illustrated, endothermic peaks are detected also at 172° C. and 498° C. as shown in Table 3. Similarly, an exothermic peak is detected at 224° C.

In FIG. 4, two endothermic peaks are detected within the range of not less than 550° C. and not more than 700° C. in the heating process. An endothermic reaction indicates that melting, decomposition, etc., of the brazing material occurs. The occurrence of an endothermic peak within the range of not less than 550° C. and not more than 700° C. indicates that the melting of the brazing material occurs in this temperature range. The melting of the brazing material indicates that a bonding reaction is occurring.

Among the endothermic peaks at 550 to 700° C., it is favorable for at least one peak height to be not less than 0.04 mW/mg. The peak height indicates the size of the reaction. By including a large endothermic peak, bonding in this temperature range can be possible. It is therefore favorable for the peak height to be not less than 0.04 mW/mg, and more favorably not less than 0.07 mW/mg.

It is favorable for the brazing material to include Ag (silver), Cu (copper), and Ti (titanium). A brazing material that includes Ag, Cu, and Ti is one type of active metal brazing material. The active metal brazing material can securely bond the ceramic substrate and the copper plate. The bonding temperature can be set to be not more than 800° C. by the brazing material including the endothermic peak at 550 to 700° C. in the heating process.

Also, it is favorable for the brazing material to include at least two endothermic peaks within the range of not less than 550° C. and not more than 650° C. in the heating process. Bonding is possible even with one endothermic peak. Having at least two endothermic peaks indicates that the melting reaction occurs in multiple stages. Due to the melting occurring in multiple stages, the bonding layer changes, and the reaction proceeds. Also, among the endothermic peaks at 550 to 650° C., it is favorable for at least one peak height to be not less than 0.04 mW/mg.

Also, when comparing the endothermic peak at 550 to 650° C. and the endothermic peak at not less than 700° C. in the heating process, it is favorable for the endothermic peak at 550 to 650° C. to be larger. In other words, the peak height of the endothermic peak at 550 to 650° C. in the heating process is greater than the peak height of the endothermic peak at not less than 700° C. in the heating process. When there are at least two endothermic peaks within the range of 550 to 650° C., the largest peak is used as the reference. Also, when there are at least two endothermic peaks at not less than 700° C., the peak that has the largest peak height is used as the reference. The peak that has the largest peak height is called the maximum peak.

When the endothermic peak at 550 to 650° C. is larger, this indicates that a large melting reaction does not occur at not less than 700° C. Also, when comparing the ratio of the peak heights, it is favorable for the ratio to be not less than 2. The ratio is represented by (peak height of largest endothermic peak at 550 to 650° C.)/(peak height of largest endothermic peak at not less than 700° C.). When the peak ratio is not less than 2, it can be said that the major melting reaction is completed within the range of 550 to 650° C. Also, It is more favorable for the peak height of the endothermic peak at not less than 700° C. to be smaller. Most favorably, there is no endothermic peak at not less than 700° C. A smaller endothermic peak at not less than 700° C. indicates more strongly that a melting reaction does not occur. In other words, a smaller endothermic peak at not less than 700° C. indicates more strongly that the melting reaction is substantially completed at not more than 700° C., and even 550 to 650° C.

It is favorable for the brazing material to have an endothermic peak within the range of not less than 450° C. and not more than 520° C. in the heating process. Also, it is favorable for the peak height of the endothermic peak within the range of not less than 450° C. and not more than 520° C. to be not less than 0.07 mW/mg. When Ti is included in the brazing material by adding TiH₂ (titanium hydride), the reaction of decomposing into Ti and H occurs within the range of 450 to 520° C. This decomposition reaction is the major part of the endothermic reaction. Hydrogen after decomposing has the effect of removing oxygen or activating metal components in the brazing material. This endothermic peak may not exist when simple Ti, etc., other than a hydride is added.

Figure 5:
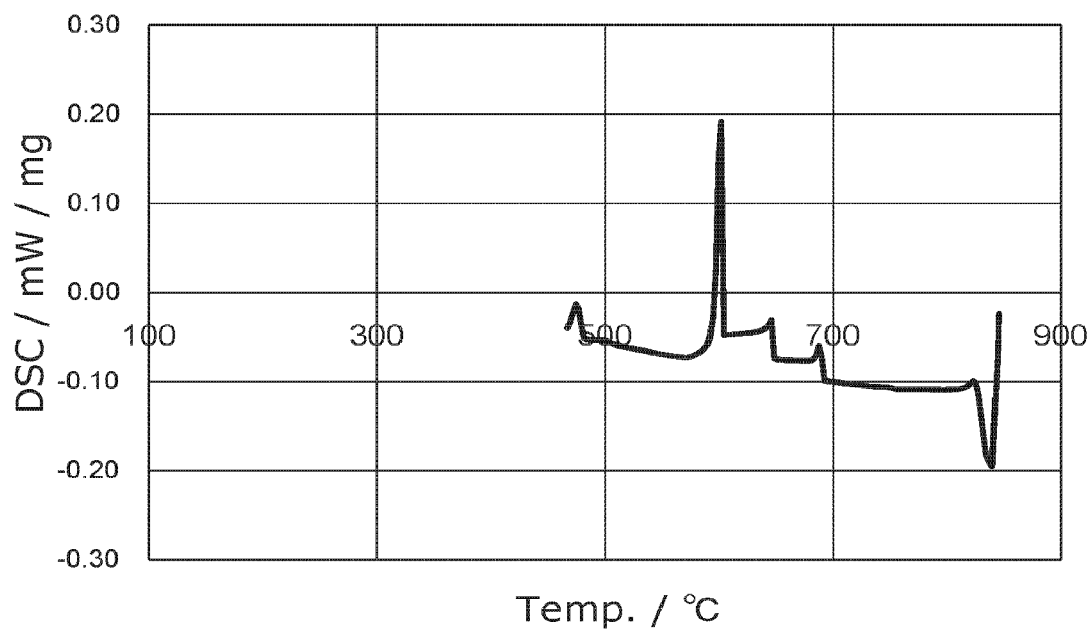
FIG. 5 is an example of the DSC curve (not less than 450° C.) of the cooling process of the example 1.
Figure 10:
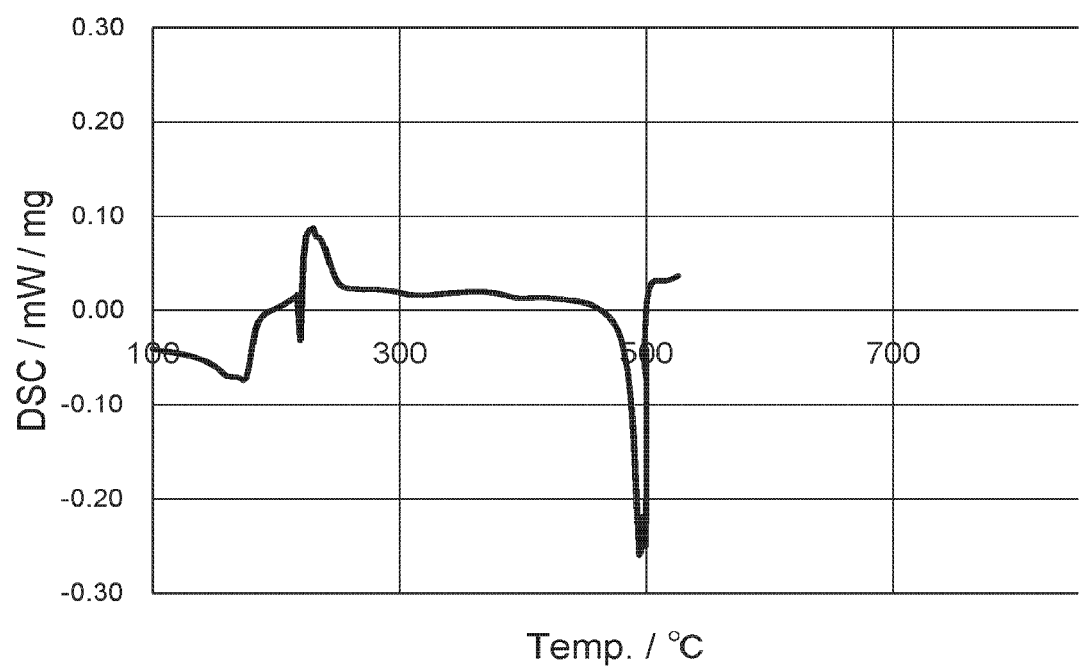
FIG. 10 is an example of the DSC curve (not more than 550° C.) of the heating process of an example 3.

It is favorable for the brazing material to have one or both of an endothermic peak or an exothermic peak within the range of not less than 140° C. and not more than 300° C. in the DSC curve of the heating process. Also, it is favorable for the peak height of one of the endothermic peak or the exothermic peak within the range of not less than 140° C. and not more than 300° C. to be not less than 0.04 mW/mg. FIG. 5 shows the DSC curve of the heating process of the example 3. FIG. 10 shows the range of not more than 550° C. in the DSC curve of not less than 100° C. and not more than 845° C. As shown in Table 3 described below, there are endothermic peaks at 172° C. and 220° C. Also, exothermic peaks are detected at 217° C. and 232° C.

To cause an endothermic peak or an exothermic peak within the range of not less than 140° C. and not more than 300° C. in the heating process, it is favorable for the brazing material to include Sn (tin). For example, when a Ag—Cu—Ti brazing material includes Sn, an endothermic reaction occurs due to the Sn melting, and an exothermic reaction occurs due to the formation of a SnAg compound or a SnCu compound. By causing an endothermic peak or an exothermic peak at a temperature that is less than the endothermic reaction (the melting reaction) at 550 to 650° C., the reaction can be promoted in multiple stages. Therefore, the thermal stress can be relaxed.

In particular, it is favorable for an exothermic peak to exist. Also, it is favorable for the height of the exothermic peak to be not less than 0.04 mW/mg. This indicates that the reaction of forming the SnAg compound or the SnCu compound has sufficiently proceeded. It is therefore favorable for the height of the exothermic peak to be not less than 0.04 mW/mg, and more favorably not less than 0.05 mW/mg.

Figure 11:
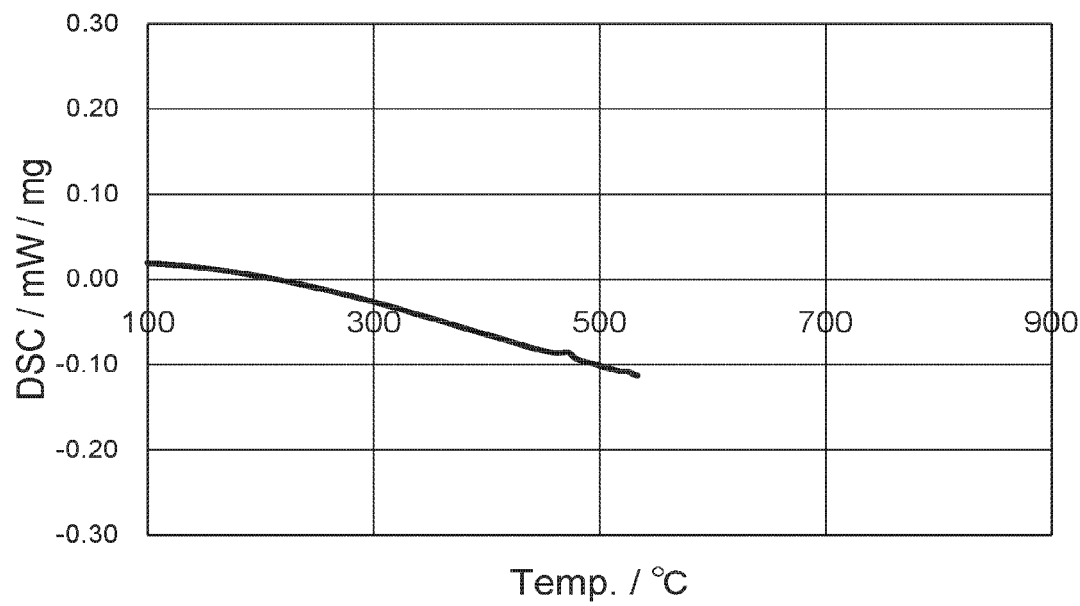
FIG. 11 is an example of the DSC curve (not more than 550° C.) of the cooling process of the example 3.

In the DSC curve of the cooling process, it is favorable for peaks within the range of not less than 140° C. and not more than 300° C. to be small. A small peak within the range of not less than 140° C. and not more than 300° C. in the cooling process indicates that the reaction of forming the SnAg compound or the SnCu compound substantially does not occur. That is, this indicates that the reaction of forming the SnAg compound or the SnCu compound in the heating process is sufficiently promoted. A small peak refers to the peak not being detected or the peak height being less than 0.04 mW/mg. It is most favorable for peaks not to be detected within the range of not less than 140° C. and not more than 300° C. in the DSC curve of the cooling process. FIG. 11 shows the DSC curve of the cooling process of the example 3. FIG. 11 shows not more than 550° C. of the DSC curve that is not less than 100° C. and not more than 845° C. Also, as shown in Table 3 described below, peaks are not detected within the range of not less than 140° C. and not more than 300° C. in the DSC curve of the cooling process of the example 3.

Also, it is favorable for an exothermic peak to exist at not less than 400° C. and not more than 700° C. in the cooling process. Also, it is favorable for the maximum peak of the exothermic peak in the cooling process to be within the range of 500 to 650° C. An exothermic peak of the cooling process occurs due to solidifying or the formation of a compound (an alloy) of the bonding layer. The thermal stress that is generated when the melted brazing material solidifies is the greatest. This is because stress that is caused by the thermal expansion difference when cooling is generated after the bonding interface is formed due to the constraints of components having mutually-different thermal expansion coefficients. When the maximum peak of the exothermic peak in the cooling process is less than 500° C., there is a possibility that the solidifying temperature may be too low, and the reliability of the bond may degrade. On the other hand, when the maximum peak is high, i.e., greater than 650° C., there is a possibility that the thermal stress may be excessively large.

It is important for the maximum peak of the exothermic peak in the cooling process to be within the range of 500 to 650° C. The thermal stress can be relaxed by completing the main solidification reaction up to 500° C. in the cooling process. It is unnecessary for the completed bonding layer of the bonded body to be completely a melted structure; and the completed bonding layer may have a partially melted structure. The partially-melted bonding layer is a mixture of a melted structure and an unmelted structure. An unmelted structure also is called a melted-apart-structure.

Also, it is favorable for the occurrence temperature of the peak top of the exothermic peak at not less than 400° C. and not more than 700° C. in the cooling process to be not less than 10° C. less than the occurrence temperature of the peak top of the endothermic peak at not less than 400° C. and not more than 700° C. in the heating process. The occurrence of the thermal stress in the cooling process can be suppressed by lowering the temperature of the peak top in the cooling process.

Also, it is favorable for the brazing material to have an exothermic peak within the range of not less than 450° C. and not more than 520° C. in the DSC curve of the cooling process. The exothermic peak is a peak in the positive direction. The endothermic peak within the range of 450 to 520° C. in the heating process is mainly caused by the decomposition reaction of $TiH_2$. Conversely, the exothermic peak in the cooling process is caused by the solidification of the bonding layer or an exothermic reaction for forming a Ti compound. TiN (titanium nitride), AgTi, CuTi, TiC, etc., are examples of Ti compounds. Ti is an active metal. The bondability is more stable when a Ti compound exists in the bonding layer than when simple Ti exists in the bonding layer.

FIG. 5 shows the DSC curve of the cooling process of the example 1. FIG. 5 shows the range of not less than 450° C. In FIG. 5, exothermic peaks are detected at 477° C., 602° C., 644° C., and 688° C. In the DSC curve of the cooling process, a peak is not detected within the range of not less than 140° C. and not more than 300° C. This indicates that the formation of SnAg or SnCu in the heating process is promoted. Also, the maximum peak of the exothermic peak in the cooling process is detected at 500 to 650° C.

Also, it is favorable for the brazing material composition to include not less than 0 mass % and not more than 75 mass % of Ag (silver), not less than 15 mass % and not more than 85 mass % of Cu (copper), and not less than 1 mass % and not more than 15 mass % of Ti (titanium) or $TiH_2$ (titanium hydride). Also, when both Ti and $TiH_2$ are used, the total is within the range of not less than 1 mass % and not more than 15 mass %. Also, when both Ag and Cu are used, it is favorable for Ag to be 20 to 60 mass % and for Cu to be 15 to 40 mass %.

As necessary, the brazing material composition may include not less than 1 mass % and not more than 50 mass % of one or two of Sn (tin) or In (indium). Also, it is favorable for the content of Ti or $TiH_2$ to be not less than 1 mass % and not more than 15 mass %, and more favorably not less than 1 mass % and not more than 6 mass %. When the content of Ti is not more than 6 mass %, at least two endothermic peaks are easily caused to occur within the range of 550 to 650° C. by the combination of Sn or In. Also, as necessary, not less than 0.1 mass % and not more than 2 mass % of C (carbon) may be included.

The ratio of the brazing material composition is calculated so that the total of the mixed raw materials is 100 mass %. For example, when the three of Ag, Cu, and Ti are included, Ag+Cu+Ti=100 mass %. Also, when the four of Ag, Cu, $TiH_2$, and In are included, Ag+Cu+$TiH_2$+In=100 mass %. Also, when the five of Ag, Cu, Ti, Sn, and C are included, Ag+Cu+Ti+Sn+C=100 mass %.

It is favorable for the mass ratio Ag/Cu of the brazing material composition to be not more than 1.3. The endothermic peak at 550 to 700° C. in the heating process is a reaction that melts the brazing material components and generates a liquid phase. The mass ratio Ag/Cu of a general active metal brazing material is 2.3 (=7/3). This is because this ratio makes eutectic AgCu. When the mass ratio Ag/Cu is 2.3, an endothermic peak is not formed at 550 to 700° C. This is because the liquidus temperature is high.

It is favorable for the mass ratio Sn/Ag of the brazing material composition to be not less than 0.25. Also, it is favorable for the mass ratio In/Ag to be not less than 0.25. By this range, an exothermic peak can be formed at 140 to 300° C. in the heating process. Peaks at 140 to 300° C. in the heating process indicates an endothermic reaction of melting Sn and an exothermic reaction of forming SnAg or SnCu. The liquidus temperature can be at 600° C. vicinity by increasing the formation amount of SnAg or SnCu. Thereby, the endothermic peak at 550 to 700° C. can be larger. This is similar even when using a low melting-point metal such as In, etc., instead of Sn.

C (carbon) has the effect of lowering the solidifying temperature of the bonding layer in the cooling process.

Thereby, the occurrence temperature of the peak top of the exothermic peak at not less than 400° C. and not more than 700° C. in the cooling process can be not less than 10° C. less than the occurrence temperature of the peak top of the endothermic peak at not less than 400° C. and not more than 700° C. in the heating process.

It is favorable for the average grain size $D_{50}$ of the Ag powder that is a raw material of the brazing material to be not more than 3.0 μm, and more favorably not more than 2.0 μm. It is favorable for the average grain size $D_{50}$ of the Cu powder to be not more than 6.0 μm, and more favorably not more than 4.0 μm. It is favorable for the average grain size $D_{50}$ of the Ti powder or the $TiH_2$ powder to be not more than 6.0 μm, and more favorably not more than 4.0 μm. It is favorable for the average grain size $D_{50}$ of the Sn powder or the In powder to be not more than 6.0 μm, and more favorably not more than 4.0 μm. It is favorable for the average grain size $D_{50}$ of the C powder to be not more than 6.0 μm, and more favorably not more than 4.0 μm.

It is favorable that Ag powder average grain size $D_{50}$<Cu powder average grain size $D_{50}$. It is favorable that Ag powder average grain size $D_{50}$<Sn powder or In powder average grain size $D_{50}$. It is favorable that Cu powder average grain size $D_{50}$<Sn powder or In powder average grain size $D_{50}$. The contact ratio between the Ag powder and the other powders can be increased by reducing the grain size of the Ag powder. Thereby, the endothermic peak at 550 to 700° C. can be larger. Or, the endothermic peak or the exothermic peak at 140 to 300° C. can be larger.

A brazing material such as those described above is suited to a bonded body that bonds a ceramic substrate and a metal plate.

A silicon nitride substrate, an aluminum nitride substrate, an aluminum oxide substrate, an Alumina zirconia substrate, etc., are examples of the ceramic substrate. It is favorable for the thickness of the ceramic substrate to be not less than 0.1 mm and not more than 1 mm. When the substrate thickness is less than 0.1 mm, there is a possibility that the strength may decrease. Also, when greater than 1 mm, there is a possibility that the ceramic substrate may become a thermal resistor; and the heat dissipation of the ceramic copper circuit board may degrade.

It is favorable for the silicon nitride substrate to have a three-point bending strength of not less than 600 MPa. Also, it is favorable for the silicon nitride substrate to have a thermal conductivity of not less than 80 W/m·K. The substrate thickness can be reduced by increasing the strength of the silicon nitride substrate. It is therefore favorable for the three-point bending strength of the silicon nitride substrate to be not less than 600 MPa, and more favorably not less than 700 MPa. The substrate thickness of the silicon nitride substrate can be thinned to be not more than 0.40 mm, and more favorably not more than 0.30 mm.

The three-point bending strength of the aluminum nitride substrate is about 300 to 450 MPa. On the other hand, the thermal conductivity of the aluminum nitride substrate is not less than 160 W/m·K. Because the strength of the aluminum nitride substrate is low, it is favorable for the substrate thickness to be not less than 0.60 mm.

Although the three-point bending strength is about 300 to 450 MPa, an aluminum oxide substrate is inexpensive. Although the three-point bending strength of an Alumina zirconia substrate is high, i.e., about 550 MPa, the thermal conductivity is about 30 to 50 W/m·K.

A silicon nitride substrate is favorable as the ceramic substrate. Because the strength of a silicon nitride substrate is high, excellent reliability can be obtained even when a thick copper plate is bonded.

A copper plate, an aluminum plate, etc., are examples of the metal plate. Also, it is favorable for the metal plate to be a copper plate. It is favorable for the copper plate to have a thickness of not less than 0.6 mm. The thermal conductivity of a copper plate is about 400 W/m·K. The heat dissipation of the circuit board can be improved by making the copper plate thick. It is therefore favorable for the thickness of the copper plate to be not less than 0.6 mm, and more favorably not less than 0.8 mm. Also, because a silicon nitride substrate has high strength, excellent reliability can be obtained even when a thick copper plate is bonded. In other words, a copper/silicon nitride circuit board has a favorable combination when a silicon nitride substrate having a substrate thickness of not more than 0.40 mm and a three-point bending strength of not less than 600 MPa and a copper plate having a thickness of not less than 0.6 mm are bonded.

According to the method for manufacturing the bonded body according to the embodiment, the bonding temperature can be set to be not more than 800° C. Also, the bonding can be performed at not less than the maximum-peak temperature of the endothermic peak existing at 550 to 650° C. in the heating process of the brazing material. That is, the bonding temperature is not less than the maximum-peak temperature of the endothermic peak existing at 550 to 650° C. in the heating process. It is favorable for the difference between the bonding temperature and the maximum-peak temperature to be not less than 50° C. and not more than 100° C. As described above, it is favorable for the brazing material to have an endothermic peak at 550 to 650° C. For example, if the largest endothermic peak is at 600° C., it is favorable for the bonding temperature to be within the range of 650 to 700° C. In such a case as well, it is possible to bond at a temperature that is greater than 700° C. On the other hand, the thermal stress increases as the bonding temperature increases. The thermal stress is not only the reactions and solidification of the brazing material but also deformation accompanying grain growth of the copper plate, etc. The thermal stress can be reduced by reducing the bonding temperature. The warp of the bonded body of the ceramic substrate and the copper plate can be reduced by reducing the thermal stress. Also, a ceramic circuit board is made by providing the metal plate of the bonded body with a circuit configuration. An etching process can be used to provide the circuit configuration.

The thermal stress that is caused by the copper plate becomes large when the copper plate is made thick. Also, multiple components can be obtained from the ceramic substrate by increasing the size of the ceramic substrate. Obtaining multiple components is a method of obtaining small bonded bodies by cutting a large bonded body. There is also a method of subdividing the bonded body or a method of subdividing the ceramic circuit board. Scribing may be performed to easily subdivide.

According to the bonded body according to the embodiment, the warp of the bonded body can be reduced even when the ceramic substrate size is enlarged to be not less than 200 mm long and not less than 200 mm wide. Therefore, both the enlargement of the ceramic substrate size and the thickening of the copper plate can be realized. In particular, by setting the strength of the silicon nitride substrate to be not less than 600 MPa, the warp of the bonded body can be reduced even when the substrate thickness is thinned to be not more than 0.40 mm.

Also, the copper plate to be bonded may be pre-patterned into a circuit configuration or may be a blanket copper plate. The blanket copper plate is etched after bonding. Copper plates may be bonded to two surfaces of the ceramic substrate. When copper plates are bonded to two surfaces, one may be a circuit, and the opposite side may be a heat dissipation plate, or both may be circuits. Also, when copper plates are bonded to two surfaces, it is favorable for the thickness of one to be not less than 0.6 mm.

EXAMPLES

Examples 1 to 6 and Comparative Example 1

Brazing material compositions shown in Table 1 and Table 2 were prepared as the brazing material composition.

Table 1 shows the grain sizes of the raw material powders. A TiH$_2$ powder was used as the Ti component.

TABLE 1

| | Average grain size D$_{50}$ (μm) | | | | |
|---|---|---|---|---|---|
| | Ag powder | Cu powder | Sn powder | TiH$_2$ powder | C powder |
| Example 1 | 2.0 | 3.0 | 3.0 | 2.2 | 0.8 |
| Example 2 | 1.5 | 3.6 | 2.5 | 1.8 | 1.2 |
| Example 3 | 1.6 | 2.9 | 3.4 | 2.8 | 1.8 |
| Example 4 | 1.6 | 4.0 | 2.3 | 1.6 | 1.5 |
| Example 5 | 2.5 | 3.5 | 3.1 | 2.5 | — |
| Comparative example 1 | 2.5 | 1.2 | 3.0 | 3.2 | 1.9 |

TABLE 2

| | Brazing material composition (mass %) | | | | | Mass ratio | |
|---|---|---|---|---|---|---|---|
| | Ag | Cu | Sn | TiH$_2$ | C | Ag/Cu | Sn/Ag |
| Example 1 | 37.8 | 34 | 20 | 8 | 0.2 | 1.1 | 0.54 |
| Example 2 | 41.4 | 35 | 18 | 5 | 0.6 | 1.2 | 0.43 |
| Example 3 | 39.2 | 33 | 17 | 10 | 0.8 | 1.2 | 0.43 |
| Example 4 | 44.6 | 36 | 16 | 3 | 0.4 | 1.2 | 0.36 |
| Example 5 | 39 | 35 | 21 | 5 | — | 1.1 | 0.54 |
| Comparative example 1 | 48.7 | 33 | 10 | 8 | 0.3 | 1.4 | 0.21 |

Brazing material pastes were prepared by mixing the brazing material components according to the examples and the comparative example with a resin binder. The DSC curve was measured using a differential scanning calorimeter for each brazing material paste.

The TGA-DSC simultaneous thermal analyzer STA449-F3-Jupiter manufactured by NETZSCH was used as the DSC measuring device. Also, the measurement was performed in an Ar flow by dropping an appropriate amount of the brazing material into an alumina container. Also, the flow rate of the Ar flow when measuring was set to 20 ml/minute at the sample side and 200 ml/minute at the cooling side. The temperature program was set to the condition shown in FIG. 3. The DSC curves in the range of not less than 100° C. and not more than 845° C. were measured for each.

The detected temperatures of the endothermic peak and the exothermic peak in the heating process and the cooling process are shown in Table 3.

TABLE 3

| | Heating process | | Cooling process | |
|---|---|---|---|---|
| | Endothermic peak temperature(° C.) | Exothermic peak temperature(° C.) | Endothermic peak temperature(° C.) | Exothermic peak temperature(°C.) |
| Example 1 | 172, 498, 606, 671, 713 | 224, 581, 619 | 462, 567, 604, 678 | 477, 602, 644, 688 |
| Example 2 | 171, 220, 499, 572, 609, 632, 664 | 217, 238, 565, 577, 621, 654 | 449, 540, 606, 635 | 482, 508, 569, 601, 608, 642 |
| Example 3 | 173, 220, 499, 607, 696, 751 | 217, 232, 594, 614, 715 | 581, 603, 689 | 601, 682, 731, 824 |
| Example 4 | 168, 217, 494, 570, 602, 642 | 210, 228, 560, 585, 619 | 545, 577, 596 | 539, 569, 591, 610 |
| Example 5 | 176, 220, 499, 572, 612, 634 | 215, 233, 564, 577, 622, 641 | 464, 560, 603, 655 | 479, 601, 621, 662 |
| Comparative example 1 | 161, 501, 756, 786 | 216, 515, 648, 768 | 629, 749 | 735, 777 |

Figure 6:
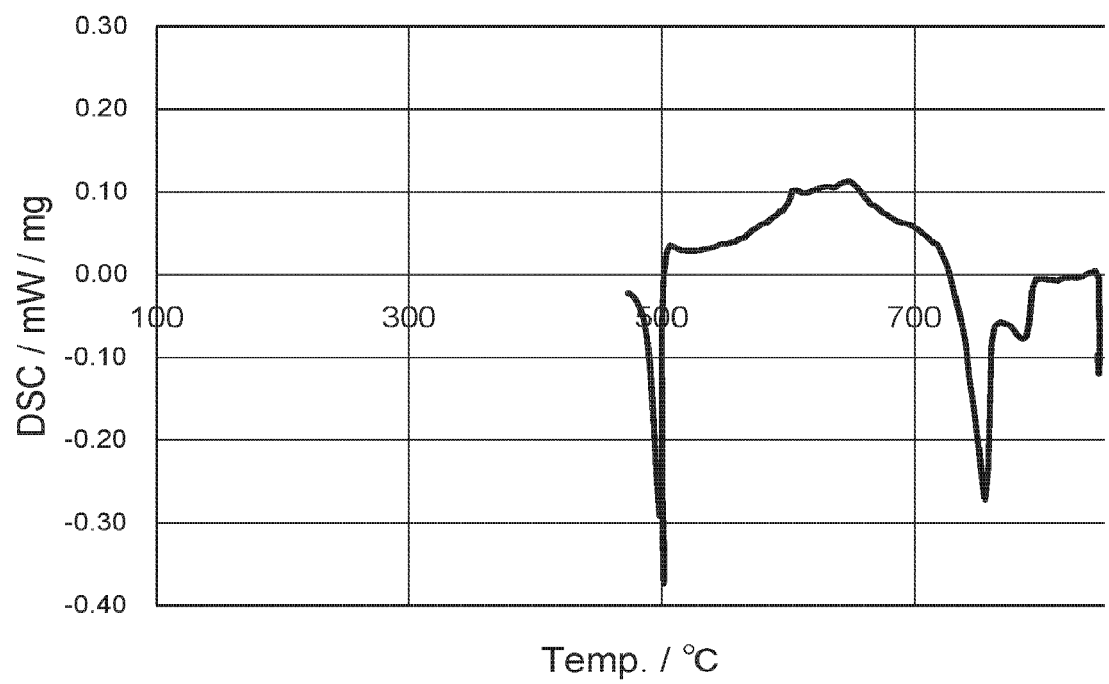
FIG. 6 is an example of the DSC curve (not less than 450° C.) of the heating process of a comparative example 1.
Figure 7:
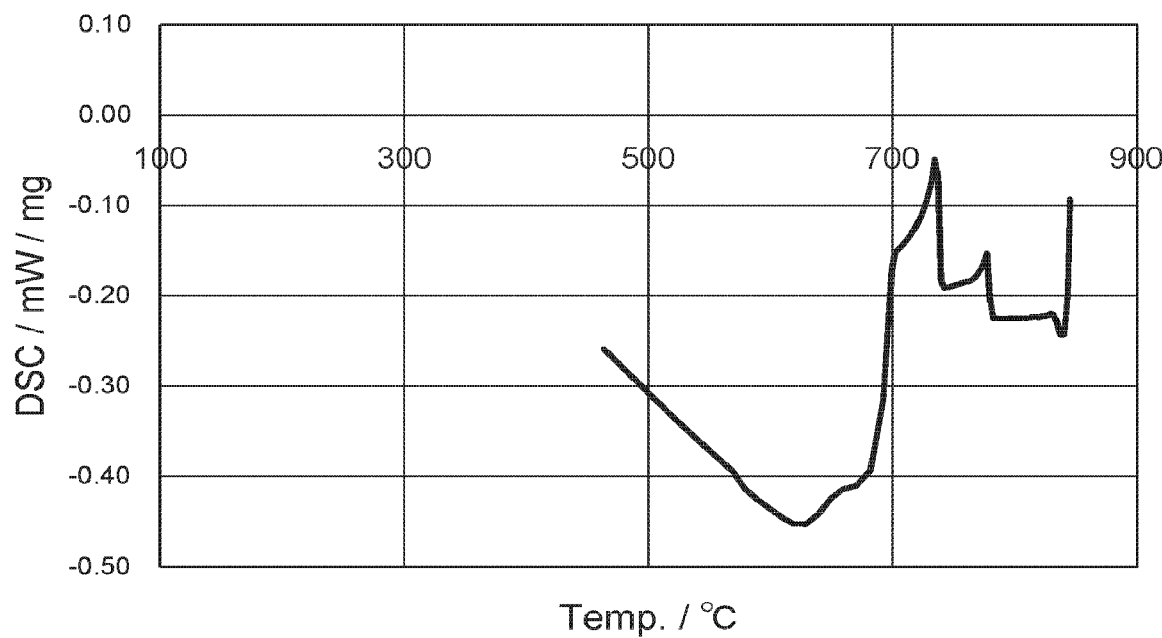
FIG. 7 is an example of the DSC curve (not less than 450° C.) of the cooling process of the comparative example 1.
Figure 8:
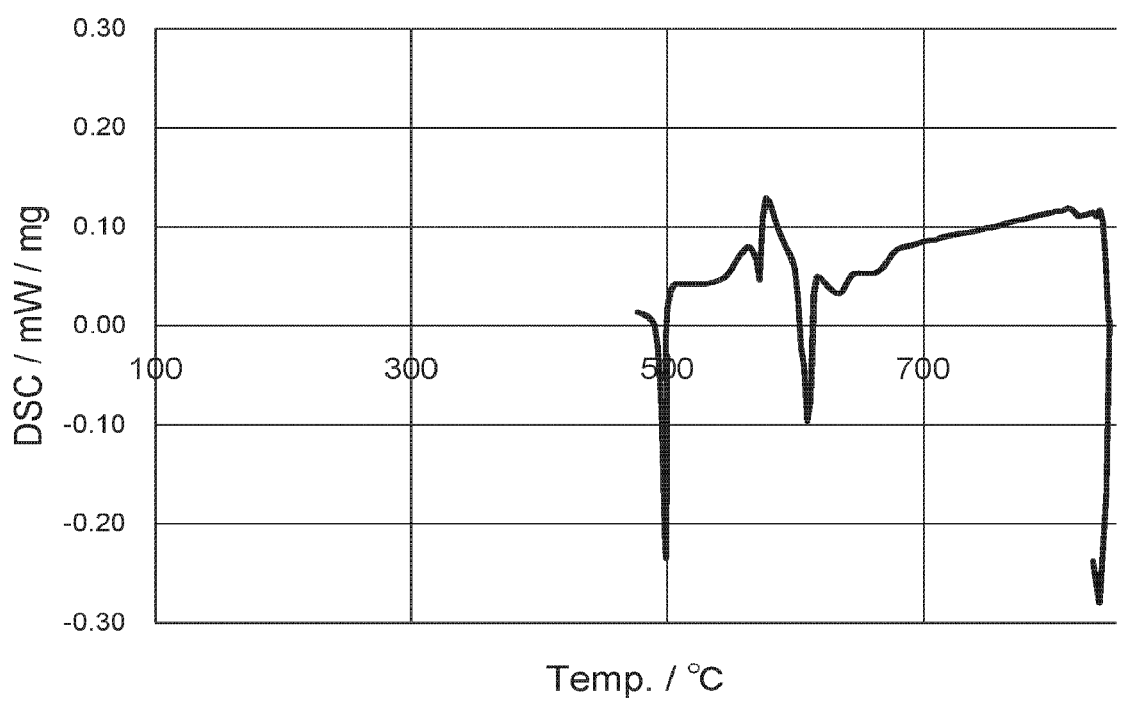
FIG. 8 is an example of the DSC curve (not less than 450° C.) of the heating process of an example 2.
Figure 9:
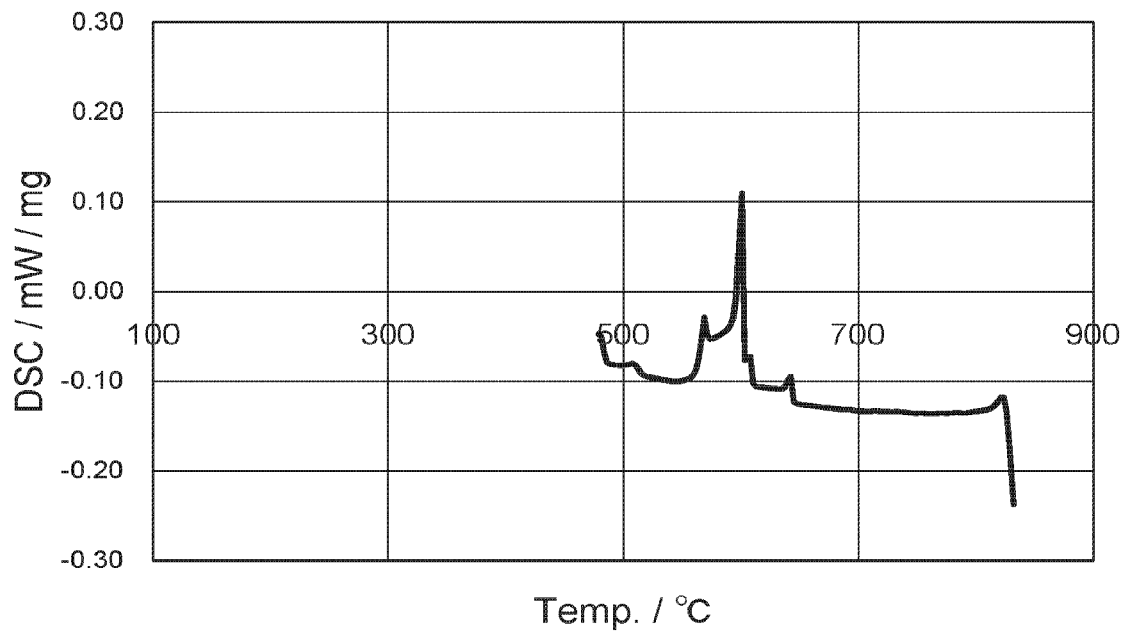
FIG. 9 is an example of the DSC curve (not less than 450° C.) of the cooling process of the example 2.
Figure 12:
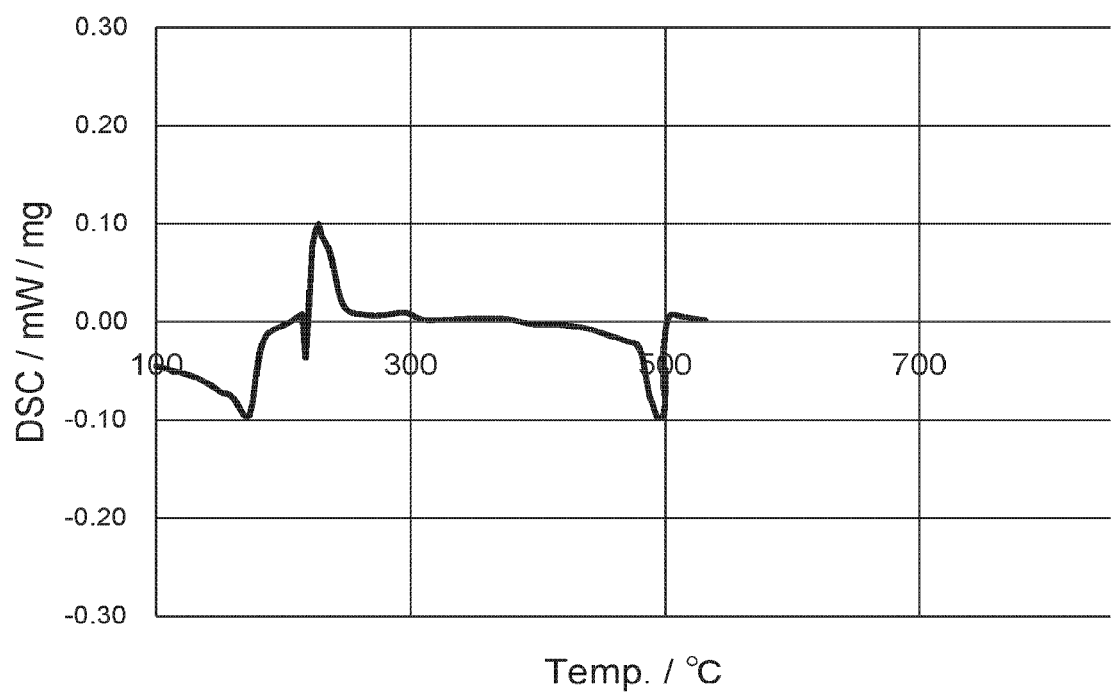
FIG. 12 is an example of the DSC curve (not more than 550° C.) of the heating process of an example 4.
Figure 13:
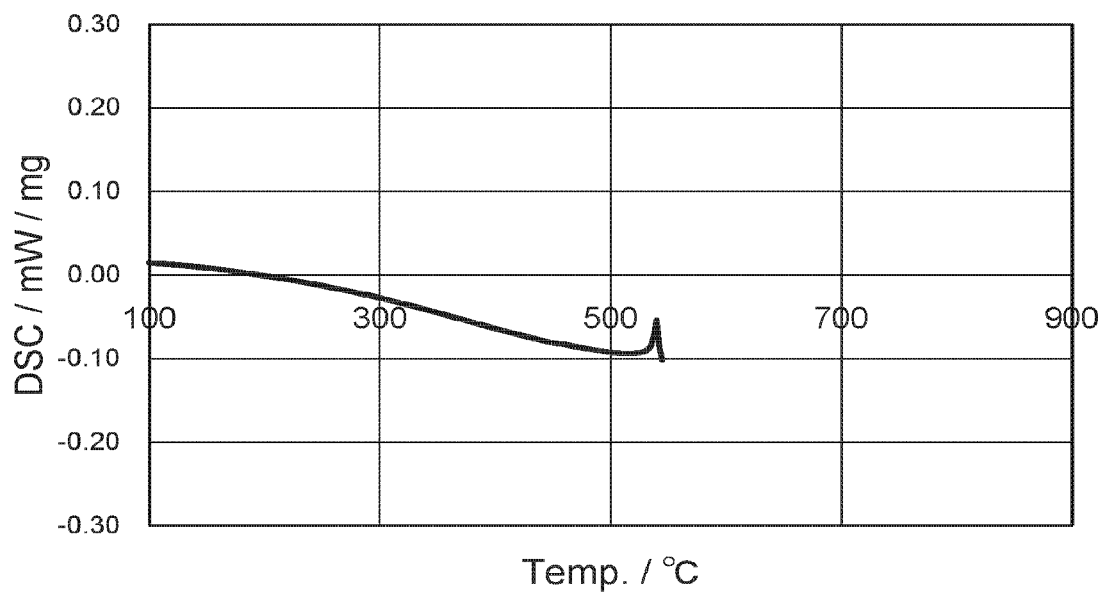
FIG. 13 is an example of the DSC curve (not more than 550° C.) of the cooling process of the example 4.
Figure 14:
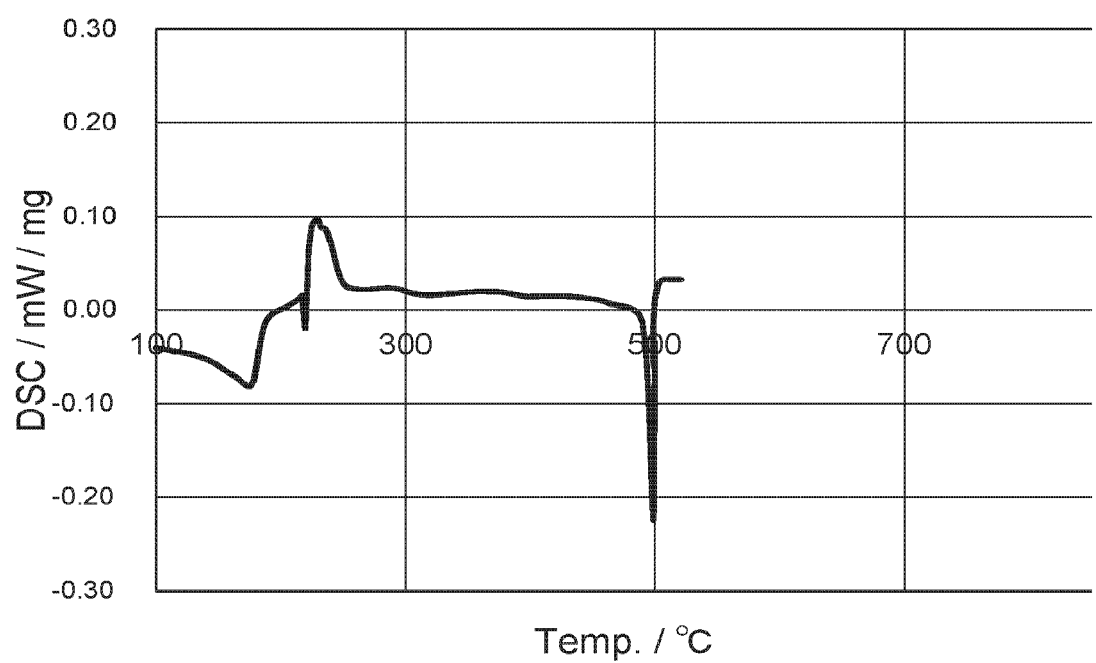
FIG. 14 is an example of the DSC curve (not more than 550° C.) of the heating process of an example 5.
Figure 15:
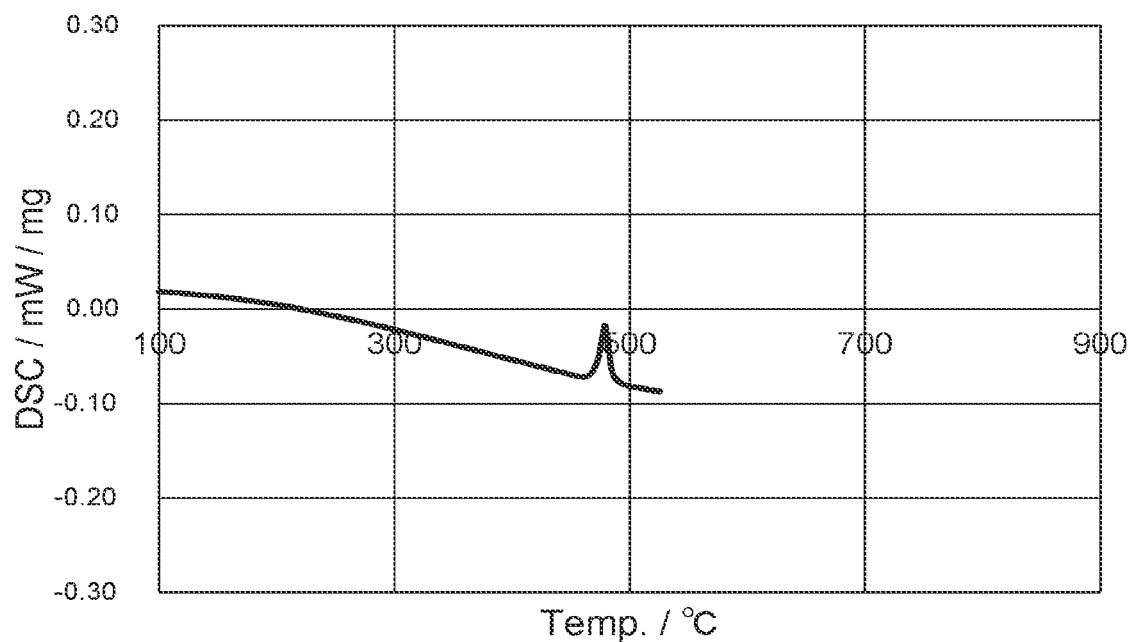
FIG. 15 is an example of the DSC curve (not more than 550° C.) of the cooling process of the example 5.

FIG. 4 shows an example of the DSC curve (not less than 450° C.) of the heating process of the example 1. FIG. 5 shows an example of the DSC curve (not less than 450° C.) of the cooling process of the example 1. FIG. 6 shows an example of the DSC curve (not less than 450° C.) of the heating process of the comparative example 1. FIG. 7 shows an example of the DSC curve (not less than 450° C.) of the cooling process of the comparative example 1. FIG. 8 shows an example of the DSC curve (not less than 450° C.) of the heating process of the example 2. FIG. 9 shows an example of the DSC curve (not less than 450° C.) of the cooling process of the example 2. FIG. 10 shows an example of the DSC curve (not more than 550° C.) of the heating process of the example 3. FIG. 11 shows an example of the DSC curve (not more than 550° C.) of the cooling process of the example 3. FIG. 12 shows an example of the DSC curve (not more than 550° C.) of the heating process of the example 4. FIG. 13 shows an example of the DSC curve (not more than 550° C.) of the cooling process of the example 4. FIG. 14 shows an example of the DSC curve (not more than 550° C.) of the heating process of the example 5. FIG. 15 shows an example of the DSC curve (not more than 550° C.) of the cooling process of the example 5.

In the comparative example 1 (FIG. 6), an endothermic peak was not detected within the range of 550 to 700° C. in the heating process. Conversely, endothermic peaks were detected within the range of 550 to 700° C. for the brazing materials according to the examples. When comparing the endothermic peaks at 550 to 700° C. and the endothermic peaks in the range greater than 700° C., the endothermic peaks were smaller in the range greater than 700° C. This indicates that the melting reaction of the brazing material is promoted in the range of 550 to 700° C. Also, in the comparative example 1 (FIG. 7), an exothermic peak was not detected at 500 to 650° C.

In the example 2, the example 4, and the example 5, at least two endothermic peaks were detected within the range of 550 to 650° C. The peak height of at least one among the two detected endothermic peaks was not less than 0.07 mW/mg. Also, in the example 2, the example 4, and the example 5, endothermic peaks were not detected at temperatures greater than 700° C.

Then, a bonding process of the ceramic substrate and the copper plate was performed using the brazing materials of the examples and the comparative example. A silicon nitride substrate 1 that had a thermal conductivity of 90 W/m·K, a three-point bending strength of 700 MPa, and a plate thickness of 0.32 mm was prepared as the ceramic substrate. Also, a silicon nitride substrate 2 that had a thermal conductivity of 85 W/m·K, a three-point bending strength of 650 MPa, and a plate thickness of 0.25 mm was prepared. An aluminum nitride substrate that had a thermal conductivity of 170 W/m·K, a three-point bending strength of 400 MPa, and a plate thickness of 0.635 mm was prepared. Oxygen-free copper was used as the copper plates. A copper plate 1 having a plate thickness of 0.6 mm, a copper plate 2 having a plate thickness of 0.8 mm, and a copper plate 3 having a plate thickness of 0.3 mm were prepared.

The size of the ceramic substrate was 250 mm long×200 mm wide. Blanket copper plates were bonded to two surfaces of the ceramic substrate. The warp amount of the obtained bonded body was measured. Also, the bonding strength of the copper plate was measured.

The warp amount of the long side was measured as the warp amount of the bonded body. The warp amount of the ceramic substrate was observed from the side surface of the bonded body. The edge and the edge of the long side of the ceramic substrate were connected by a straight line. The most distant position of the ceramic substrate surface to the straight line was used as the warp amount. Bonded bodies for which the warp amount of the long side was not more than 0.1 mm are displayed as good (○); and bonded bodies for which the warp amount of the long side was greater than 0.1 mm are displayed as defective (×).

Also, the bonding strength was measured using a peel test. Specifically, peel test samples were prepared using the bonding conditions of the examples and the comparative example. In the samples, a rectangular copper plate was bonded to the ceramic substrate. At this time, the bonding was performed so that one end of the copper plate jutted from the ceramic substrate. The peel strength was measured by perpendicular pulling the jutting copper plate.

Bonded bodies for which the bonding strength was not less than 20 kN/m were taken to be best (◎); bonded bodies of not less than 15 kN/m were taken to be good (○); and bonded bodies of not more than 14 kN/m were taken to be defective (×). Table 4 shows the results.

TABLE 4

| | Brazing material | Ceramic substrate | Copper plate | Bonding temperature (° C.) | Warp amount | Bonding strength |
|---|---|---|---|---|---|---|
| Example 1A | Example 1 | Silicon nitride substrate 1 | Copper plate1 | 680 | ○ | ○ |
| Example 1B | Example 1 | Silicon nitride substrate 1 | Copper plate1 | 790 | ○ | ○ |
| Example 2A | Example 2 | Silicon nitride substrate 2 | Copper plate2 | 670 | ○ | ◎ |
| Example 2B | Example 2 | Silicon nitride substrate 2 | Copper plate2 | 780 | ○ | ◎ |
| Example 3A | Example 3 | Silicon nitride substrate 1 | Copper plate1 | 750 | ○ | ○ |
| Example 3B | Example 3 | Silicon nitride substrate 1 | Copper plate2 | 800 | ○ | ○ |
| Example 4A | Example 4 | Silicon nitride substrate 2 | Cooper plate2 | 650 | ○ | ◎ |
| Example 4B | Example 4 | Silicon nitride substrate 2 | Copper plate2 | 730 | ○ | ◎ |
| Example 5A | Example 5 | Silicon nitride substrate 2 | Copper plate1 | 680 | ○ | ◎ |
| Example 5B | Example 5 | Silicon nitride substrate 2 | Copper plate2 | 750 | ○ | ◎ |
| Example 6A | Example 1 | Aluminum nitride substrate | Copper plate3 | 680 | ○ | ○ |
| Example 6B | Example 1 | Aluminum nitride substrate | Copper plate3 | 790 | ○ | ○ |
| Comparative example 1A | Comparative example 1 | Silicon nitride substrate 1 | Copper plate1 | 850 | X | ○ |
| Comparative example 1B | Comparative example 1 | Silicon nitride substrate 1 | Copper plate1 | 780 | ○ | X |

For the bonded bodies according to the examples, the warp amount was reduced even though the bonding temperature was not more than 800° C. Also, a high bonding strength was obtained. It was found that the bonding is possible at a low temperature by controlling the endothermic peak and the exothermic peak of the DSC curve of the brazing material.

Conversely, for a comparative example 1A, when the bonding temperature was 850° C., the bonding strength was high, but the warp was large. This is because the thermal stress was large due to the bonding at the high temperature. Also, when the bonding temperature was lowered as in a comparative example 1B, the bonding strength decreased.

As a reference example, a silicon nitride substrate having a size of 50 mm long×50 mm wide×0.32 mm thick was prepared. A copper plate that was 50 mm long×50 mm wide×0.6 mm thick was prepared. Bonding was performed using the brazing materials of the example 1 and the comparative example 1 by setting the bonding temperature to 850° C. Good determinations were obtained for the warp amount and the bonding strength. That is, even for a conventional brazing material, the warp can be reduced if the bonded body is small. On the other hand, for a large bonded body of not less than 200 mm×200 mm, the warp was large. By using the brazing material according to the examples, the bonding temperature could be reduced, the warp could be reduced, and the bonding strength could be maintained. Therefore, the brazing material according to the examples has excellent suitability for mass production of the bonded body.

(Bonded Body)

Figure 16:
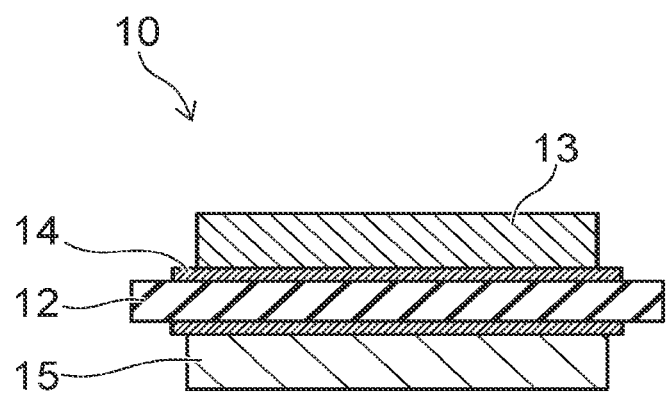
FIG. 16 is a drawing showing an example of a bonded body that uses the brazing material according to the embodiment.

FIG. 16 is a drawing showing an example of a bonded body that uses the brazing material according to the embodiment. In FIG. 16, 10 is a ceramic circuit board. 12 is a ceramic substrate. 13 is a front metal plate. 14 is a bonding layer. 15 is a back metal plate. The front metal plate 13 and the back metal plate 15 each are bonded to the ceramic substrate 12 via the bonding layer 14. The brazing material according to the embodiment is favorable for the bonded body illustrated in FIG. 16. By using the brazing material according to the embodiment, for example, the reliability of the bonded body can be increased. The ceramic circuit board 10 is obtained by providing the front metal plate 13 or the back metal plate 15 of the bonded body with a circuit configuration. Also, in the bonded body, the longitudinal and lateral sizes of the front metal plate 13 or the back metal plate 15 may be the same as the ceramic substrate 12. An etching process, etc., can be used to provide the circuit configuration.

(Bonded Body•Ceramic Circuit Board)

Figure 17:
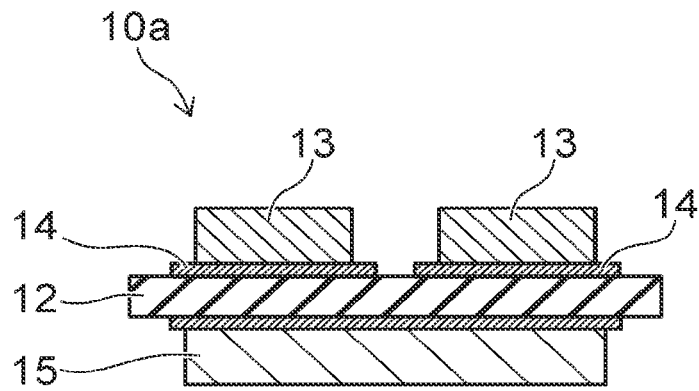
FIG. 17 is a drawing showing an example of a ceramic circuit board that uses the brazing material according to the embodiment.
Figure 18:
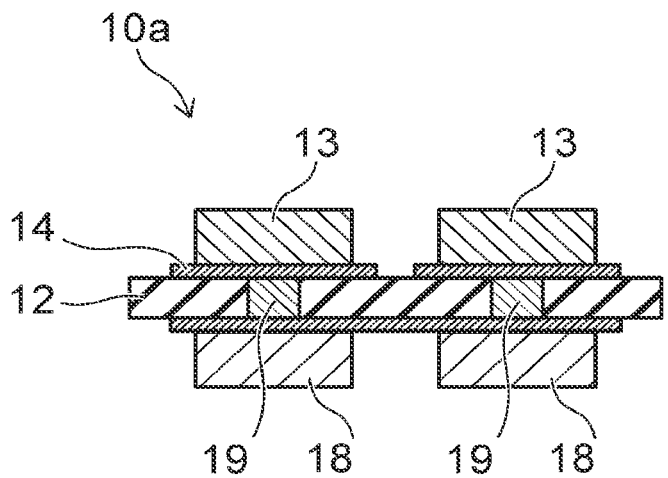
FIG. 18 is a drawing showing an example of a ceramic circuit board that uses the brazing material according to the embodiment.
Figure 19:
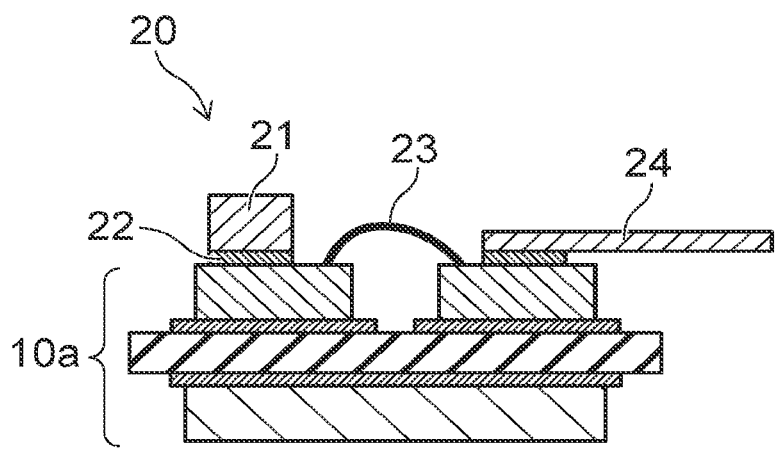
FIG. 19 is a drawing showing an example of a ceramic circuit board that uses the brazing material according to the embodiment.

FIGS. 17 to 19 are drawings showing examples of ceramic circuit boards using the brazing material according to the embodiment.

In a ceramic circuit board 10a of FIG. 17, two front metal plates 13 that are patterned into circuit configurations are bonded to the ceramic substrate 12. The embodiment is not limited to this example; three or more front metal plates 13 may be bonded to the ceramic substrate 12.

A through-hole may be provided in the ceramic substrate. It is favorable for the ceramic circuit board to have a structure in which the metal plate at the front and the metal plate at the back are electrically connected via the through-hole. FIG. 18 shows an example of a ceramic circuit board that has a through-hole. FIG. 18 is a cross-sectional view at a portion where the through-hole is provided. In FIG. 18, 10a is a ceramic circuit board. 12 is a silicon nitride substrate. 13 is a front metal plate. 14 is a bonding layer. 18 is a back metal plate. 19 is a through-hole. In FIG. 18, the front metal plate 13 and the back metal plate 18 are electrically connected via the through-hole 19. In FIG. 18, multiple through-holes 19 respectively connect multiple front metal plates 13 and multiple back metal plates 18. The embodiment is not limited to such a structure. In the ceramic circuit board 10a, the through-hole 19 may be provided for only a portion of the multiple front metal plates 13. The through-hole 19 may be provided for only a portion of the multiple back metal plates 18. It is favorable for the same material as the bonding layer 14 to be filled into the through-hole 19. The structure inside the through-hole 19 is not particularly limited as long as the front metal plate and the back metal plate can be electrically connected. Therefore, a metal thin film may be located at only the through-hole 19 inner wall. On the other hand, the bonding strength can be increased by filling with the same material as the bonding layer 14.

The silicon nitride circuit board according to the embodiment is favorable in a semiconductor device. In the semiconductor device, a semiconductor element is mounted to the metal plate of the ceramic circuit board via the bonding layer. FIG. 19 shows an example of the semiconductor device. In FIG. 19, 10a is a ceramic circuit board. 20 is a semiconductor device. 21 is a semiconductor element. 22 is a bonding layer. 23 is wire bonding. 24 is a metal terminal. In FIG. 19, the semiconductor element 21 is bonded onto the metal plate of the ceramic circuit board 10a via the bonding layer 22. Similarly, the metal terminal 24 is bonded via the bonding layer 22. The wire bonding 23 electrically connects between the adjacent metal plates. In FIG. 19, other than the semiconductor element 21, the wire bonding 23 and the metal terminal 24 are bonded. The semiconductor device according to the embodiment is not limited to such a structure. For example, only one of the wire bonding 23 or the metal terminal 24 may be provided. A plurality of each of the semiconductor element 21, the wire bonding 23, and the metal terminal 24 may be located at each of the front metal plates 13. The semiconductor element 21, the wire bonding 23, and the metal terminal 24 can be bonded to the back metal plate 18 as necessary. Various shapes such as a leadframe shape, a protruding shape, etc., are applicable to the metal terminal 24.

By using the brazing material according to the embodiment in the ceramic circuit board or the semiconductor device described above, for example, the reliability of the ceramic circuit board or the semiconductor device can be increased.

While certain embodiments of the invention have been illustrated, these embodiments have been presented by way of example only, and are not intended to limit the scope of the inventions. These novel embodiments may be embodied in a variety of other forms; and various omissions, substitutions, modifications, etc., can be made without departing from the spirit of the inventions. These embodiments and their modifications are within the scope and spirit of the invention and are within the scope of the inventions described in the claims and their equivalents. Also, embodiments described above can be implemented in combination with each other.

What is claimed is:

1. A brazing material for bonding a ceramic substrate and a copper plate,
wherein when a total of raw elements is taken as 100 mass %, the brazing material comprises:
more than 0 mass % and not more than 75 mass % of Ag;
not less than 15 mass % and not more than 85 mass % of Cu;
not less than 1 mass % and not more than 15 mass % of one or two of Ti or $TiH_2$;
not less than 1 mass % and not more than 50 mass % of either Sn or In; and
not less than 0 mass % and not more than 2 mass % of C,
a mass ratio of Ag to Cu being not more than 1.3,
a mass ratio of Sn to Ag or a mass ratio of In to Ag being not less than 0.25,
wherein
an average grain size $D_{50}$ of Ag is less than an average grain size $D_{50}$ of Cu, and
the average grain size $D_{50}$ of Ag is less than an average grain size $D_{50}$ of Sn or In,
wherein when using a differential scanning calorimeter (DSC) a DSC curve is measured, the brazing material has an endothermic peak within a range of not less than 550° C. and not more than 700° C. in a heating process and one or both of an endothermic peak or an exothermic peak within a range of not less than 140° C. and not more than 300° C. in the heating process.

2. The material according to claim 1, wherein the brazing material has not less than two of the endothermic peaks within a range of not less than 550° C. and not more than 650° C. in the heating process.

3. The material according to claim 1, wherein the endothermic peak at not less than 550° C. and not more than 650° C. in the heating process is larger than an endothermic peak at not less than 700° C. in the heating process.

4. The material according to claim 1, wherein the brazing material has an endothermic peak within a range of not less than 450° C. and not more than 520° C. in the heating process.

5. The material according to claim 1, wherein when the total of raw elements is taken as 100 mass %, the brazing material comprises not less than 20 mass % and not more than 60 mass % of Ag, not less than 15 mass % and not more than 40 mass % of Cu, not less than 1 mass % and not more than 15 mass % of one or two of Ti or TiH$_2$, and not less than 1 mass % and not more than 50 mass % of one or two of Sn or In.

6. The material according to claim 1, wherein the brazing material comprises not less than 0.1 mass % and not more than 2 mass % of carbon.

7. The material according to claim 1, wherein an occurrence temperature of a peak top of an exothermic peak at not less than 400° C. and not more than 700° C. in a cooling process is not less than 10° C. lower than an occurrence temperature of a peak top of an endothermic peak at not less than 400° C. and not more than 700° C. in the heating process.

8. A bonded body, comprising:
a ceramic substrate;
a copper plate having a thickness of not less than 0.3 mm; and
the brazing material according to claim 1 that bonds the ceramic substrate and the metal plate.

9. The body according to claim 8, wherein
the ceramic substrate is a silicon nitride substrate, and
a thickness of the copper plate is not less than 0.6 mm.

10. A ceramic circuit board using the bonded body according to claim 8.

11. The material according to claim 2, wherein the endothermic peak at not less than 550° C. and not more than 650° C. in the heating process is larger than an endothermic peak at not less than 700° C. in the heating process.

12. The material according to claim 11, wherein the brazing material has an endothermic peak within a range of not less than 450° C. and not more than 520° C. in the heating process.

13. The material according to claim 12, wherein the brazing material includes not less than 20 mass % and not more than 60 mass % of Ag, not less than 15 mass % and not more than 40 mass % of Cu, not less than 1 mass % and not more than 15 mass % of one or two of Ti or TiH$_2$, and not less than 1 mass % and not more than 50 mass % of either Sn or In.

14. A bonded body, comprising:
a ceramic substrate;
a copper plate; and
the brazing material according to claim 13 that bonds the ceramic substrate and the metal plate.

15. A method for manufacturing a bonded body, the method comprising:
bonding a ceramic substrate and a copper plate by using the brazing material according to claim 1.

16. The method according to claim 15, wherein a bonding temperature is not more than 800° C.

17. The method according to claim 15, wherein
a bonding temperature is greater than a temperature of a largest endothermic peak within a range of not less than 550° C. and not more than 650° C. in the heating process, and
a difference between the bonding temperature and the temperature of the largest endothermic peak is not less than 50° C. and not more than 100° C.

* * * * *